United States Patent
Yao et al.

(10) Patent No.: US 8,900,541 B2
(45) Date of Patent: Dec. 2, 2014

(54) APPARATUS FOR MANUFACTURING CARBON NANOTUBE HEAT SINK

(71) Applicants: Yuan Yao, Beijing (CN); Feng-Wei Dai, Beijing (CN); Kai-Li Jiang, Beijing (CN); Chang-Hong Liu, Beijing (CN); Liang Liu, Beijing (CN)

(72) Inventors: Yuan Yao, Beijing (CN); Feng-Wei Dai, Beijing (CN); Kai-Li Jiang, Beijing (CN); Chang-Hong Liu, Beijing (CN); Liang Liu, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 263 days.

(21) Appl. No.: 13/647,514

(22) Filed: Oct. 9, 2012

(65) Prior Publication Data
US 2013/0026339 A1     Jan. 31, 2013

Related U.S. Application Data

(63) Continuation of application No. 12/609,288, filed on Oct. 30, 2009, now Pat. No. 8,309,051.

(30) Foreign Application Priority Data

Aug. 25, 2009    (CN) .......................... 2009 1 0189820

(51) Int. Cl.
*D01F 9/12*      (2006.01)
*F28F 7/00*      (2006.01)
*H01L 23/373*      (2006.01)
*H01L 21/683*      (2006.01)

(52) U.S. Cl.
CPC .......... *H01L 23/373* (2013.01); *H01L 21/6835* (2013.01); *H01L 2924/0002* (2013.01)
USPC .................. 423/447.2; 423/447.1; 423/447.3; 165/185; 156/230

(58) Field of Classification Search
CPC .............. H01L 21/6835; H01L 23/373; H01L 2924/0002; H01L 2924/00
USPC .................. 165/185; 423/447.1–447.3, 445 B
See application file for complete search history.

(56) References Cited

U.S. PATENT DOCUMENTS

2007/0155136 A1\*   7/2007   Chrysler et al. .............. 438/478
2010/0181060 A1    7/2010   Kobayashi

FOREIGN PATENT DOCUMENTS

JP      2010-171200      8/2010

\* cited by examiner

*Primary Examiner* — Daniel C McCracken
(74) *Attorney, Agent, or Firm* — Novak Druce Connolly Bove + Quigg LLP

(57) ABSTRACT

An apparatus for manufacturing a carbon nanotube heat sink includes a board, and a number of first and second carbon nanotubes formed on the board. The first carbon nanotubes and the second nanotubes are grown along a substantially same direction from the board. A height difference exists between a common free end of the first carbon nanotubes and a common free end of the second carbon nanotubes.

13 Claims, 13 Drawing Sheets

APPARATUS FOR MANUFACTURING CARBON NANOTUBE HEAT SINK

This application is a continuation of U.S. patent application Ser. No. 12/609,288, filed on Oct. 30, 2009, entitled, "APPARATUS FOR MANUFACTURING CARBON NANOTUBE HEAT SINK AND METHOD FOR MAKING THE CARBON NANOTUBE HEAT SINK," which claims all benefits accruing under 35 U.S.C. §119 from China Patent Application No. 200910189820.9, filed on Aug. 25, 2009 in the China Intellectual Property Office.

BACKGROUND

1. Technical Field

The present disclosure relates to apparatuses for manufacturing heat sinks and methods for making the heat sinks, and particularly to an apparatus for manufacturing a carbon nanotube heat sink and a method for making the carbon nanotube heat sink.

2. Discussion of Related Art

Carbon nanotubes (CNTs) are a novel carbonaceous material and have received a great deal of interest since the early 1990s. Carbon nanotubes have interesting and potentially useful electromagnetic, optical, mechanical, chemical, and other properties. Carbon nanotube applications in field emission electron sources, sensors, new optical materials, soft ferromagnetic materials are often reported. Carbon nanotubes have superior thermal conductivity. A carbon nanotube array also can be used as a heat sink.

A typical example is shown and discussed in American patent application publication No. US20070158584A1, entitled, "Heat sink with carbon nanotubes and method for manufacturing the same," published to MONG-TUNG LIN on May 16, 2007. This patent application publication discloses a heat sink and a method for making the same. The heat sink includes a base and a plurality of carbon nanotubes. The base has a first surface and a second surface facing away from the first surface. The carbon nanotubes have a main portion and a distal portion. The distal portion is embedded in the base and extends from the first surface to the second surface of the base. The main portion extends from the second surface in a direction away from the first surface of the base. The method for manufacturing the heat sink comprises: providing a substrate, forming a plurality of carbon nanotubes on the substrate, forming a base in which one end of the carbon nanotubes is embedded, removing the substrate, and obtaining the heat sink. However, due to the greater density of carbon nanotubes in the heat sink, heat accumulated at the carbon nanotubes does not convect well to the air.

In an article entitled, "Chip cooling with integrated carbon nanotube microfin architectures," by K. Kordas et al., Appl. Phys. Lett. 90. 123105(2007), a heat sink of a carbon nanotube fin array and a method for manufacturing the same to overcome the above-mentioned drawbacks are disclosed. Structures of 10×10 carbon nanotube fin array blocks are fabricated in a freestanding carbon nanotube fin array by laser-assisted surface patterning with a defocused pulsed laser. The carbon nanotube fin array having the carbon nanotube fin array blocks is a heat sink. Each carbon nanotube array block has a size of 1.2×1.0×1.0 mm$^3$ and a mass of 0.27 mg. A gap is between every two of the carbon nanotube array blocks of the heat sink, so that heat convects to the air easily.

However, only one heat sink can be made from one carbon nanotube array by the above-described method. The efficiency is low and the cost is high.

What is needed, therefore, is to provide a highly efficient method for making the carbon nanotube heat sink and an apparatus for manufacturing carbon nanotube heat sink.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements.

It should be noted that references to "an" or "one" embodiment in this disclosure are not necessarily to the same embodiment, and such references mean at least one.

Figure 1:
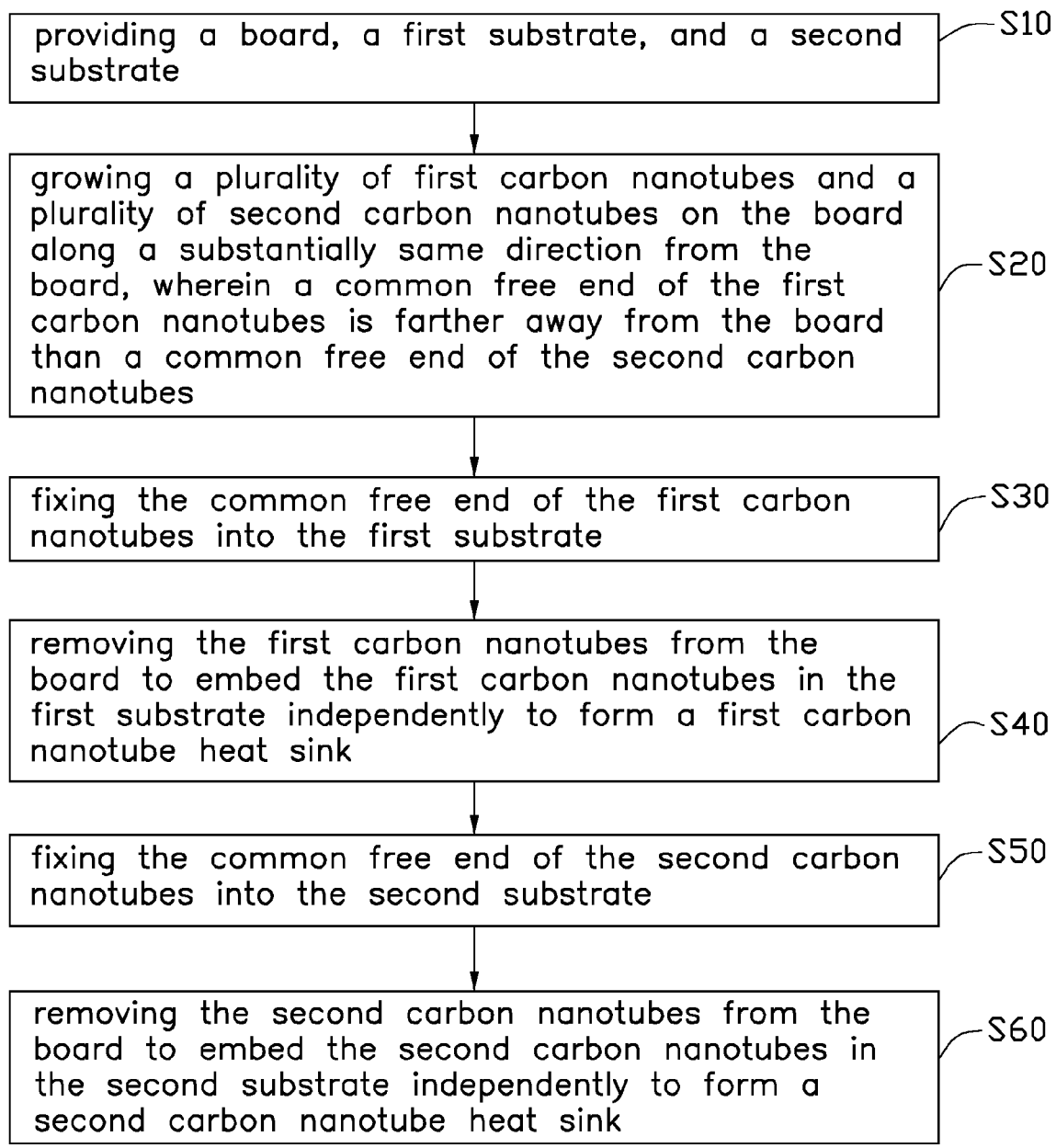
FIG. 1 illustrates a flow chart of one embodiment of a method for manufacturing a carbon nanotube heat sink using one embodiment of an apparatus for manufacturing a heat sink.

Referring to FIG. 1, the present disclosure provides a method for manufacturing a carbon nanotube heat sink. The method includes the following steps.

Figure 2:
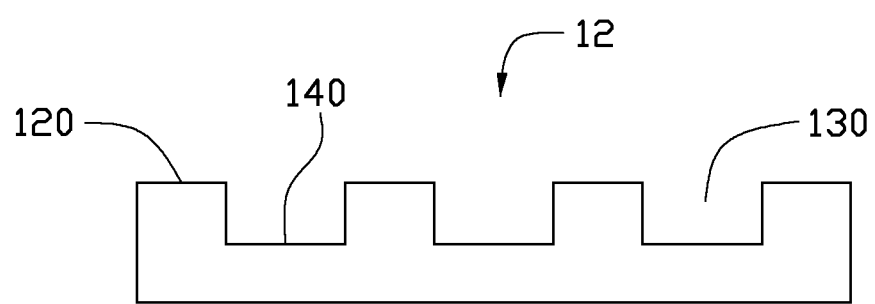
FIG. 2 to FIG. 7 each illustrates different sectional views of manufacturing the carbon nanotube heat sink.

In step S10, referring also to FIG. 2, aboard 12 is provided. A plurality of grooves 130 is defined in the board 12 and arranged in a matrix manner. The board 12 has bottom surfaces of the grooves and top surfaces. Each top surface of the board 12 is regarded as a first growing surface 120. Each bottom surface of the grooves 130 is regarded as a second growing surface 140. In other words, the first growing surfaces 120 and the second growing surfaces 140 are alternately arranged. The first growing surfaces 120 have different heights than the second growing surfaces 140 and are spaced apart from each other. The height of the first growing surfaces 120 are more than the height of the second growing surfaces 140.

The board 12 can be made of silicon which can be a P-type or N-type silicon. The board 12 can also have an oxide layer. The board 12 can be founded or etched to obtain the grooves 130. The grooves 130 can be divided into one-layer grooves, two-layers grooves, or N-layers grooves according to a distance between the bottom surface of each of the grooves to the top surface of the board 12. Within the same layer of the grooves 130, a distance between the bottom surface of each groove 130 and the top surface of the board 12 is the same.

Figure 8:
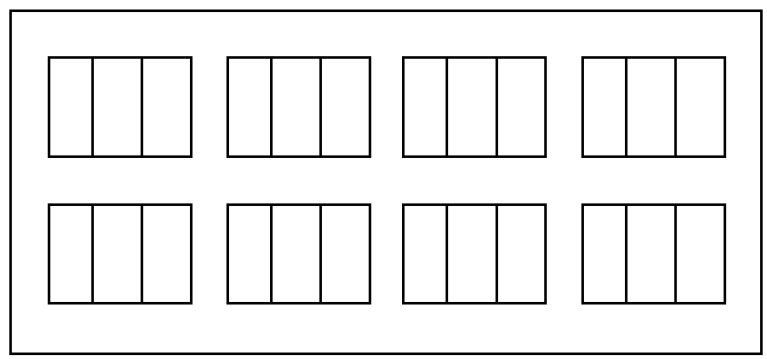
FIG. 8 illustrates a top view of a board having a plurality of grooves arranged in a ladder shape.
Figure 9:
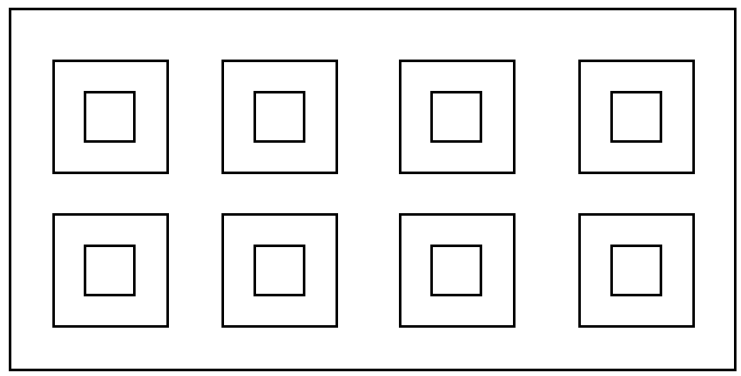
FIG. 9 illustrates a top view of the board having a plurality of grooves wherein each of the grooves is two-layers and concentric.
Figure 11:
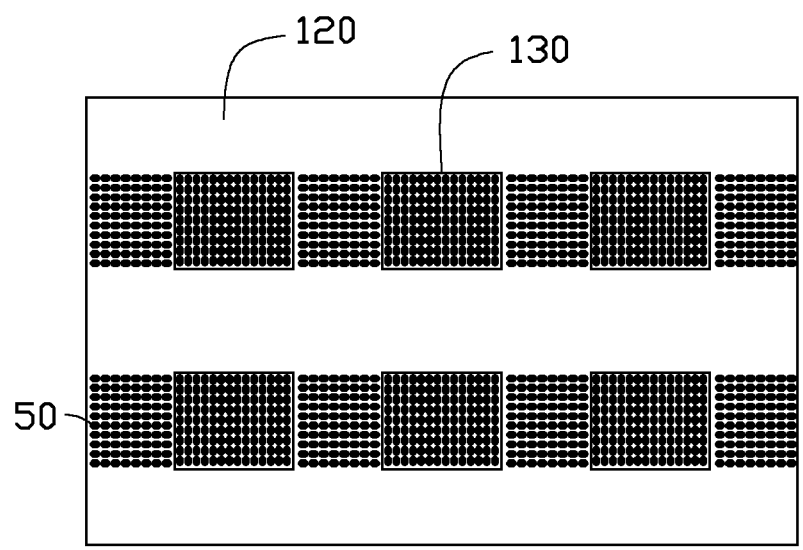
FIG. 11 illustrates a schematic view of the board where a catalyst layer is formed.
Figure 13:
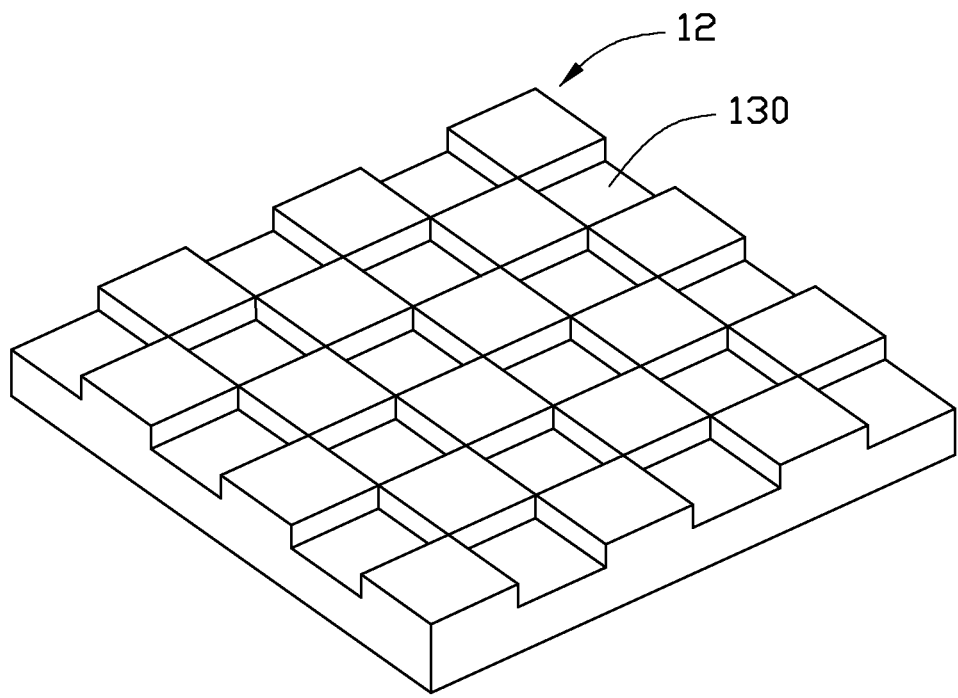
FIG. 13 illustrates a schematic view of a board having a plurality of grooves arranged in a staggered manner.

The shape of the grooves 130 can be arbitrary. Referring to FIG. 8, the grooves 130 are arranged in a ladder shape. Referring to FIG. 9, each of the grooves 130 are two-layers and concentric. Referring to FIG. 13, the grooves 130 are arranged in the board 12 in a staggered manner. Referring to FIG. 11, in one embodiment, a 3×2 groove matrix is formed on the board 12. Each of the grooves 130 is a one-layer groove and each second growing surface 140 has a rectangular configuration.

Figure 3:
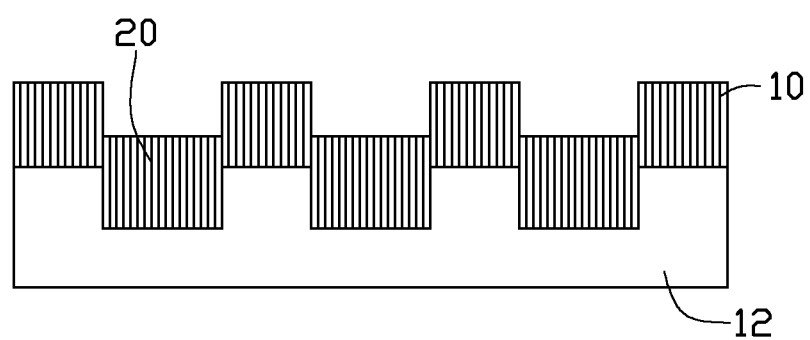

In step S20, referring to FIG. 2 and FIG. 3, the board 12 has a top surface and a bottom surface opposite to the top surface of the board 12. The top surface of the board 12 is defined as the first growing surface 120. Each of the grooves 130 has an inner bottom surface defined as a second growing surface 140. There is a height difference between the first growing surfaces 120 and the second growing surfaces 140 because the second growing surfaces 140 are lower than the first growing surfaces 120 compared to the bottom surface of the board 12. A plurality of carbon nanotubes is formed on the first growing surfaces 120 and the second growing surfaces 140. The carbon nanotubes have substantially the same length. Carbon nanotubes on the first growing surface 120 are defined as first carbon nanotubes 10. Carbon nanotubes on the second growing surface 140 are defined as second carbon nanotubes 20. Therefore, although the lengths of the first carbon nanotubes 10 and the lengths of the second carbon nanotubes 20 are the same, free ends of the first carbon nanotubes 10 are farther away from the bottom surface of the board 12 than free ends of the second carbon nanotubes 20. The first carbon nanotubes 10 and the second carbon nanotubes 20 are grown along a substantially same direction. Carbon nanotubes in the second carbon nanotubes 20 are grown above the first growing surface 120. There is a height difference between free ends of the first carbon nanotubes 10 and free ends of the second carbon nanotubes 20.

Figure 10:
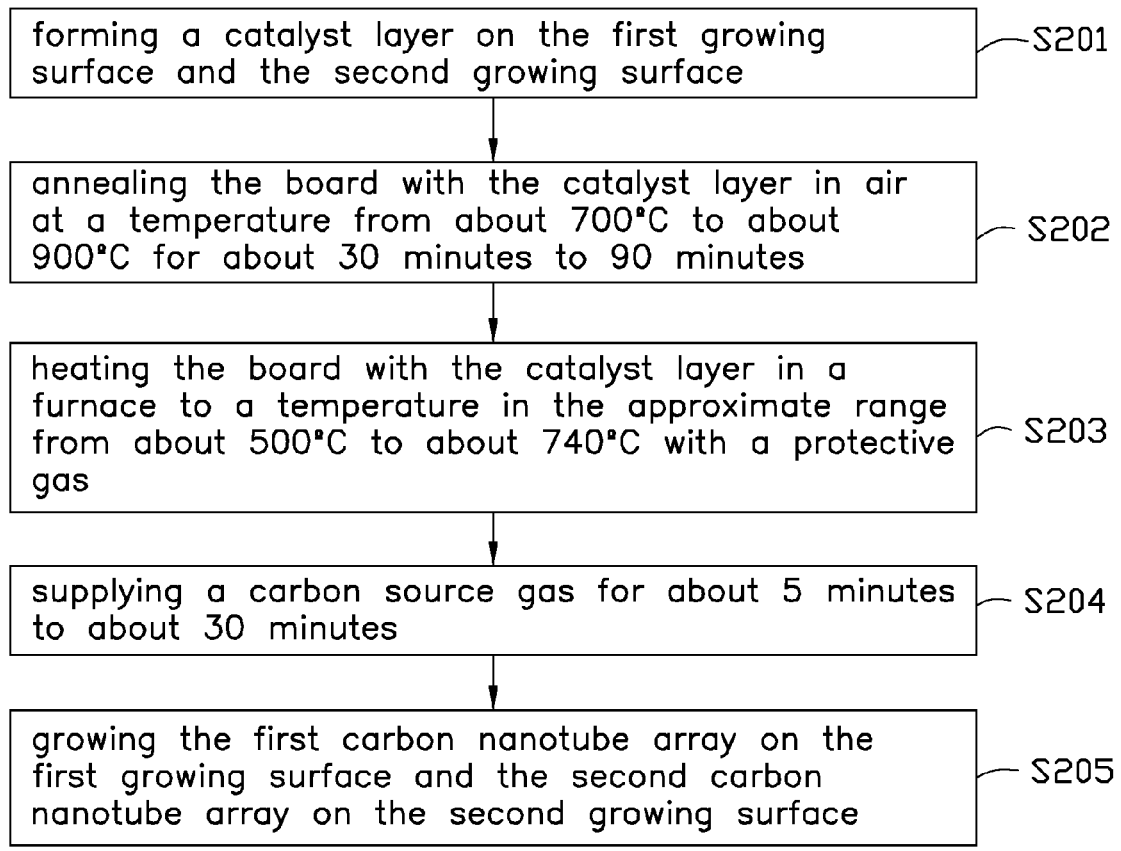
FIG. 10 illustrates a flowchart of one embodiment of a method for manufacturing a carbon nanotube array.

Referring to FIG. 10, in the step S20, the method for forming the first carbon nanotube array 10 and the second carbon nanotube array 20 on the first growing surface 140 and the second growing surface 140, can include three of the following substeps:

Step S201, forming a catalyst layer on the first growing surface 120 and the second growing surface 140;

Step S202, annealing the board 12 with the catalyst layer in air at a temperature from about 700° C. to about 900° C. for about 30 minutes to 90 minutes;

Step S203, heating the board 12 with the catalyst layer in a furnace to a temperature in the approximate range from about 500° C. to about 740° C. with a protective gas;

Step S204, supplying a carbon source gas for about 5 minutes to about 30 minutes; and Step S205, growing the first carbon nanotube array 10 on the first growing surface 120 and the second carbon nanotube array 20 on the second growing surface 140.

In the step S201, the catalyst layer can be made of iron (Fe), cobalt, nickel, or any alloy thereof. In one embodiment, the catalyst layer is made of Fe. The shape of the catalyst layer can be arbitrary. Referring to FIG. 11, the catalyst layer 50 has a matrix configuration. Each catalyst layer 50 formed on the first growing surface 120 is alternately arranged with each groove 130.

In the step S203, the carbon source gas can be a hydrocarbon gas, such as ethylene ($C_2H_4$), methane ($CH_4$), acetylene ($C_2H_2$), ethane ($C_2H_6$), or any combination thereof. The protective gas can be made up of at least one of nitrogen ($N_2$), ammonia ($NH_3$), and an inert gas. The first carbon nanotube array 10 and the second nanotube array 20 can have the same length because both of them are grown in one growing process.

Figure 4:
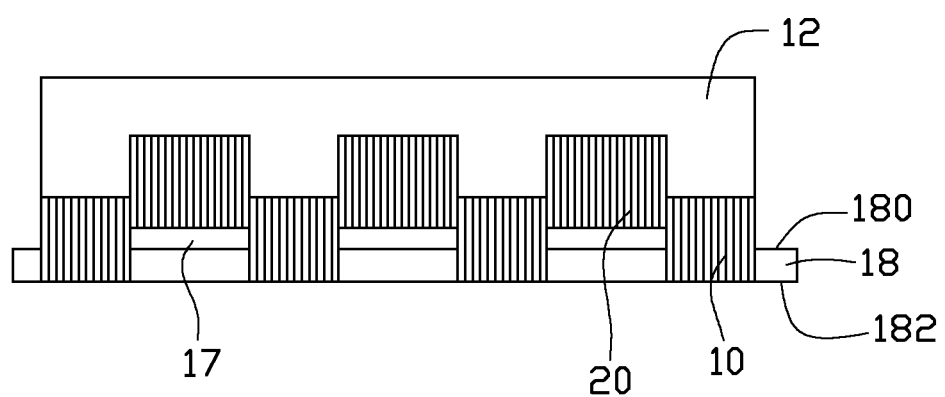

In step S30, referring to FIG. 4, a first substrate 18 is provided, the board 12 with the first and second carbon nanotube arrays 10, 20 is inverted, and the common free end of the first carbon nanotube array 10 is fixed into the first substrate 18.

The first substrate 18 can be made of a phase change polymer or a low melting point metallic material. The thickness of the first substrate is in the range from about 0.1 mm to about 1.0 cm.

The phase change polymer can be a polymer such as silicone rubber, polyester, polyvinyl chloride polymer, polyvinyl alcohol, polyethylene, polypropylene, ethoxyline, polyformaldehyde, and paraffin wax which can change from a solid phase to a fluid phase at a certain temperature range. Furthermore, at least one additive can be added into the phase change polymer. The additive is incorporated in the phase change polymer to improve the flexibility and stability of the phase change polymer and can also adjust the phase-change temperature of the phase change polymer to suit different requirements.

Furthermore, a number of heat conducting particles can be dispersed in the phase change polymer to improve the heat conduction coefficient of the first substrate 18. The heat conducting particles can be metallic particles, ceramic particles and admixture thereof. The metallic particles can be aluminum (Al) particles, silver (Ag) particles, copper (Cu) particles, and combinations thereof. The ceramic particles can be alumina particles, aluminum nitride particles, boron nitride particles, or combinations thereof. The mass ratio of the heat conducting particles in the phase change polymer can be in a range of about 0.1% to about 5%.

The low melting point metallic material can be tin (Sn), copper (Cu), indium (In), lead (Pb), antimony(Sb), gallium (Ga), gold (Au), silver (Ag), bismuth (Bi), aluminum (Al), alloy thereof or mixture thereof. The alloy can be an alloy of tin and lead, an alloy of indium and tin, an alloy of tin and silver, an alloy of gold and gallium, or an alloy of antimony and bismuth.

The method for fixing the common free end of the first carbon nanotube array 10 into the first substrate 18 can comprise:

Step S301, dipping the common free end of the first carbon nanotube array 10 into a molten first substrate 18 and preventing the second carbon nanotube array 20 from being dipped into the first substrate 18;

Step S302, solidifying the first substrate 18 to fix the common free end of the first carbon nanotube array 10 into the solidified first substrate 18.

In the step S301, there is a gap 17 between the common free end of the second carbon nanotube array 20 and the first substrate 18. In the step S302, solidified first substrate 18 has a first top surface 180 and a bottom surface 182 opposite to the top surface 180.

Figure 5:
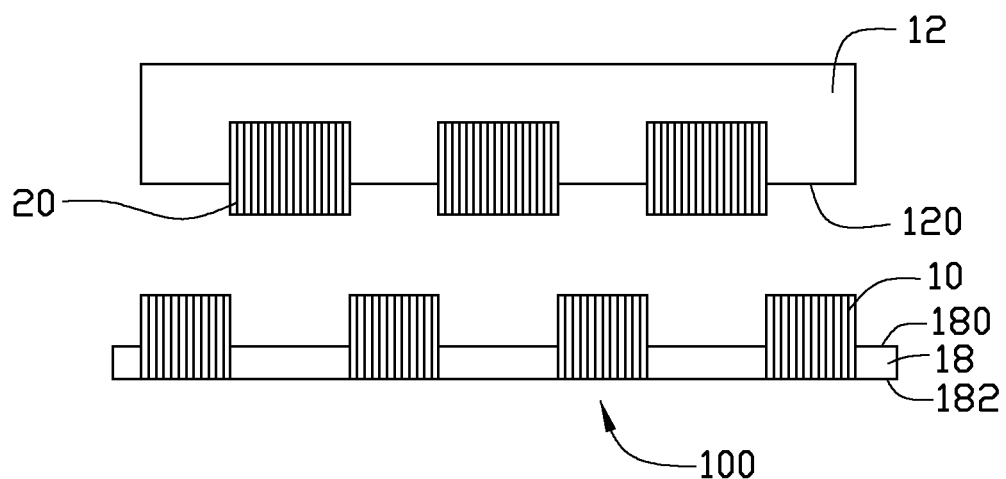

In step S40, referring to FIG. 5, the first carbon nanotube array 10 is removed from the first growing surface 120. The first carbon nanotube array 10 is fixed by the first substrate 18 independently. The first carbon nanotube array 10 and the first substrate 18 constitute a first carbon nanotube heat sink 100. The first carbon nanotube array 10 extends through from the bottom surface 182 to the top surface 180 of the first substrate 18 and continuously extends in a direction away from the top surface 180.

In one embodiment, the first substrate 18 is made of paraffin wax. The thickness of the first substrate 18 is about 1 millimeter (mm) The height of the carbon nanotubes of the first carbon nanotube array 10 is about 3 mm. The first carbon nanotube array 10 has a 4×2 array block configuration. Each array block has a rectangular configuration. The eight array blocks are spaced apart from each other so that the heat is easily convected from the carbon nanotubes to the air.

The step for removing the first carbon nanotube array 10 can be by mechanical whetting, etching and so on. In one embodiment, the first carbon nanotube array 10 is pulled apart from the first substrate 18. The binding force of the first carbon nanotube array 10 and the board 12 is weak because the first carbon nanotube array 10 is just grown on the board 12. However, the first carbon nanotube array 10 is fixed in the first substrate 18 and the binding force of the first carbon nanotube array 10 and the first substrate 18 is strong. Therefore, by using a small force, the first carbon nanotube array 10 can be pulled apart from the board 12.

An additional step of etching the second surface 182 of the first substrate 18 of the first carbon nanotube heat sink 100 to expose more carbon nanotubes can be executed after step S40. It is to be understood that, depending on different materials of the first substrate 18, the method for etching the first substrate 18 could be different. When the first substrate 18 is made of paraffin wax, the first substrate 18 can be made by oxygen plasma etching. When the first substrate 18 is made of metal, the first substrate 18 can be made by acid etching. The first carbon nanotube array 10 is exposed from both the top surface 180 and the bottom surface 182 to fully contact the first carbon nanotube heat sink 100 with the air or the heat source.

Figure 6:
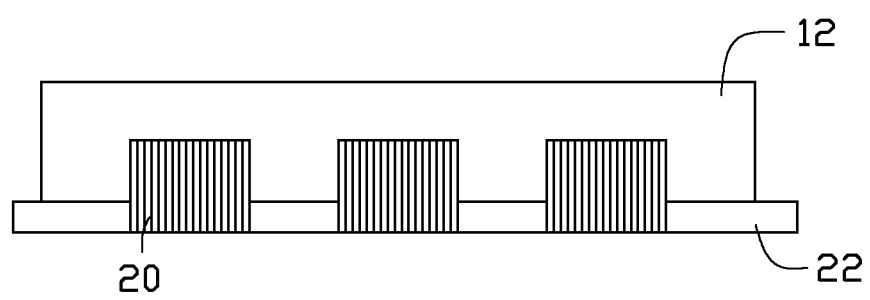

In step S50, referring to FIG. 6, a second substrate 22 is provided, and the board 12 is inverted to fix the common free end of the second carbon nanotube array 20 into the second substrate 22. Step 50 is similar to step 30, and the second substrate 22 can be made of a phase change polymer or a low melting point metallic material. In one embodiment, the second substrate 22 is made of paraffin wax. The thickness of the second substrate is in the range from about 0.1 mm to about 1.0 cm.

Figure 7:
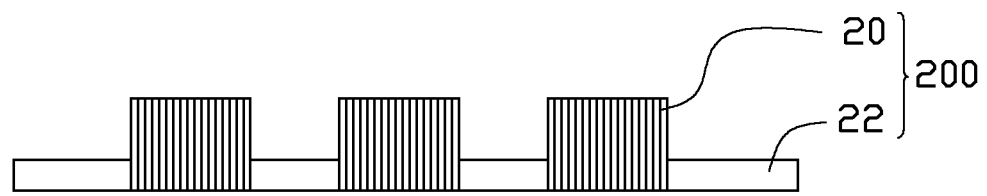

In step 60, referring to FIG. 7, the second carbon nanotube array 20 is removed from the second growing surface 140. The second carbon nanotube array 20 is fixed in the second substrate 22 independently. The second carbon nanotube array 20 and the second substrate 22 constitute a second carbon nanotube heat sink 200. The method of step 60 is similar to the method of step 40.

Figure 12:
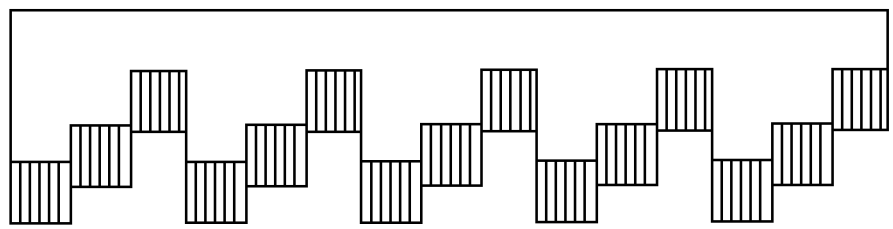
FIG. 12 illustrates a front view of one embodiment of an apparatus for manufacturing a heat sink having a plurality of two-layers grooves, the apparatus including a board.

Referring to FIG. 12, in one embodiment, three carbon nanotube arrays with different heights can be grown on the board 12 having a plurality of two-layers grooves.

The present disclosure provides an apparatus for manufacturing a carbon nanotube heat sink. The apparatus comprises a board 12, a plurality of first carbon nanotubes, and a plurality of second carbon nanotubes formed on the board. A height difference exists between the common free end of the first carbon nanotubes and the second carbon nanotubes. More carbon nanotube heat sinks can be obtained by using the above-described apparatus having grooves. The efficiency of manufacturing a heat sink is improved and the cost of manufacturing a heat sink is relatively low by using the present disclosure.

Depending on the embodiments, certain of the steps described in the description and claims may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. The above-described embodiments are intended to illustrate the scope of the disclosure and not restrict the scope of the disclosure.

What is claimed is:

1. An apparatus for manufacturing carbon nanotube heat sink comprising:
   a board;
   a plurality of first carbon nanotubes formed on the board; and
   a plurality of second carbon nanotubes formed on the board;
   wherein the plurality of first carbon nanotubes and the plurality of second carbon nanotubes extend along a substantially same direction from the board; a first height difference exists between free ends of the plurality of first carbon nanotubes and free ends of the plurality of second carbon nanotubes.

2. The apparatus of claim 1, wherein the board has a first surface and a second surface opposite to the first surface, a plurality of grooves is defined in the board at the first surface, and each of the plurality of grooves has an inner bottom surface.

3. The apparatus of claim 2, wherein the plurality of first carbon nanotubes are located on the first surface of the board, and the plurality of second carbon nanotubes are located on the inner bottom surface in each of the plurality of grooves.

4. The apparatus of claim 2, wherein the plurality of grooves have the same depth.

5. The apparatus of claim 2, wherein each of the plurality of grooves is a ladder-shaped structure comprising a plurality of steps, and the plurality of steps have the same height.

6. The apparatus of claim 5, wherein the plurality of second carbon nanotubes are located on the plurality of steps.

7. The apparatus of claim 3, wherein lengths of the plurality of first carbon nanotubes and the plurality of second carbon nanotubes are the same.

8. The apparatus of claim 7, wherein both the free ends of the plurality of first carbon nanotubes and the free ends of the plurality of second carbon nanotubes extend over the first surface of the board.

9. The apparatus of claim 1, wherein the board defines a first growing area and a second growing area on a surface, and the first growing area and the second growing area have a second height difference.

10. The apparatus of claim 9, wherein the plurality of first carbon nanotubes are located on the first growing area and the plurality of second carbon nanotubes are located on the second growing area, and the lengths of the plurality of first carbon nanotubes is equal to the lengths of the plurality of the second carbon nanotubes.

11. The apparatus of claim 10, wherein the first height difference is equal to the second height difference.

12. An apparatus for manufacturing carbon nanotube heat sink comprising:
   a board having a first surface and a second surface opposite to the first surface;
   a plurality of grooves defined in the board at the first surface, each of the plurality of grooves having an inner bottom surface;
   a plurality of first carbon nanotubes located on the first surface of the board; and a plurality of second carbon nanotubes located on the inner bottom surface of each of the plurality of grooves;

wherein free ends of the plurality of first carbon nanotubes are farther away from the second surface of the board than free ends of the plurality of second carbon nanotubes.

13. The apparatus of claim 12, wherein both the free ends of the plurality of first carbon nanotubes and the free ends of the plurality of second carbon nanotubes extend over the first surface.

* * * * *